US012653079B2

(12) United States Patent
Park et al.

(10) Patent No.: US 12,653,079 B2
(45) Date of Patent: Jun. 9, 2026

(54) METHOD OF FABRICATING SEMICONDUCTOR PACKAGE

(71) Applicant: SAMSUNG ELECTRONICS CO., LTD., Suwon-si (KR)

(72) Inventors: Ji-Yong Park, Suwon-si (KR); Jeong Hyun Lee, Suwon-si (KR); Choong Bin Yim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 545 days.

(21) Appl. No.: 18/112,323

(22) Filed: Feb. 21, 2023

(65) Prior Publication Data

US 2024/0030176 A1 Jan. 25, 2024

(30) Foreign Application Priority Data

Jul. 20, 2022 (KR) ........................ 10-2022-0089476

(51) Int. Cl.
H10W 90/00 (2026.01)
H10W 70/05 (2026.01)
(Continued)

(52) U.S. Cl.
CPC ....... H10W 90/701 (2026.01); H10W 70/093 (2026.01); H10W 70/65 (2026.01);
(Continued)

(58) Field of Classification Search
CPC . H01L 21/4853; H01L 21/561; H01L 21/565; H01L 2224/16227; H01L 2224/16238;

H01L 2224/29005; H01L 2224/3201; H01L 2224/32058; H01L 2224/32059; H01L 2224/32225; H01L 2224/73204; H01L 2224/73253; H01L 2224/81; H01L 2224/83091;
(Continued)

(56) References Cited

U.S. PATENT DOCUMENTS 8,383,457 B2    2/2013 Pagaila et al.
9,082,743 B2 *  7/2015 Hung ...................... H01L 24/73
(Continued)

FOREIGN PATENT DOCUMENTS

KR    10-2016-0012589 A     2/2016
KR      20160012589 A  *  2/2016  ........... H01L 25/105
(Continued)

OTHER PUBLICATIONS

Communication dated Jan. 6, 2026, issued by the Korean Ministry of Intellectual Property in Korean Application No. 10-2022-0089476.

*Primary Examiner* — Telly D Green
(74) *Attorney, Agent, or Firm* — Sughrue Mion, PLLC

(57) ABSTRACT

A method of fabricating a semiconductor package includes providing a semiconductor chip having solder balls formed on a bottom surface thereof, forming an adhesive layer on a top surface of the semiconductor chip, mounting the semiconductor chip on a first wafer using the solder balls, bonding a second wafer to the first wafer and to the adhesive layer of the semiconductor chip that is mounted on the first wafer, forming a molding layer between the first wafer and the second wafer, and cutting the first wafer, the molding layer and the second wafer.

20 Claims, 14 Drawing Sheets

(51) Int. Cl.

| | |
|---|---|
| *H10W 70/65* | (2026.01) |
| *H10W 70/68* | (2026.01) |
| *H10W 72/00* | (2026.01) |
| *H10W 72/30* | (2026.01) |
| *H10W 74/01* | (2026.01) |
| *H10W 74/10* | (2026.01) |
| *H10W 74/15* | (2026.01) |

(52) U.S. Cl.
CPC ....... *H10W 70/68* (2026.01); *H10W 72/0198* (2026.01); *H10W 74/014* (2026.01); *H10W 74/016* (2026.01); *H10W 74/121* (2026.01); *H10W 90/401* (2026.01); *H10W 72/07332* (2026.01); *H10W 72/07341* (2026.01); *H10W 72/07352* (2026.01); *H10W 72/07353* (2026.01); *H10W 72/321* (2026.01); *H10W 72/334* (2026.01); *H10W 72/877* (2026.01); *H10W 74/15* (2026.01); *H10W 90/724* (2026.01); *H10W 90/734* (2026.01)

(58) Field of Classification Search
CPC ....... H01L 2224/83201; H01L 2224/96; H01L 2224/97; H01L 23/13; H01L 23/3128; H01L 23/3135; H01L 23/49811; H01L 23/49816; H01L 23/49833; H01L 23/49838; H01L 24/13; H01L 24/16; H01L 24/29; H01L 24/32; H01L 24/73; H01L 24/81; H01L 24/83; H01L 24/92; H01L 24/94; H01L 24/96; H01L 24/97; H01L 2924/1011
See application file for complete search history.

(56) References Cited

U.S. PATENT DOCUMENTS

| | | | | |
|---|---|---|---|---|
| 9,214,454 | B2 | 12/2015 | Haba et al. | |
| 9,379,090 | B1 * | 6/2016 | Syed | H01L 23/13 |
| 10,297,552 | B2 * | 5/2019 | Kim | H01L 23/3114 |
| 10,431,536 | B2 | 10/2019 | Kim et al. | |
| 11,164,754 | B2 | 11/2021 | Tsai et al. | |
| 11,515,262 | B2 * | 11/2022 | Lee | H01L 21/4853 |
| 2008/0237841 | A1 * | 10/2008 | Arana | H01L 23/433 |
| | | | | 257/E23.11 |
| 2014/0124910 | A1 * | 5/2014 | Lee | H01L 23/3142 |
| | | | | 257/668 |
| 2015/0221570 | A1 | 8/2015 | Berry et al. | |
| 2017/0162510 | A1 * | 6/2017 | Kim | H01L 23/3114 |
| 2018/0061816 | A1 * | 3/2018 | Kim | H01L 23/3675 |
| 2021/0013189 | A1 * | 1/2021 | Kim | H01L 23/49816 |
| 2021/0183777 | A1 * | 6/2021 | Yim | H01L 23/5385 |
| 2021/0384096 | A1 * | 12/2021 | Lee | H01L 23/42 |
| 2022/0352058 | A1 * | 11/2022 | Lee | H01L 23/16 |

FOREIGN PATENT DOCUMENTS

| | | | | | |
|---|---|---|---|---|---|
| KR | 20190008723 | A | * | 1/2019 | .......... H01L 25/105 |
| KR | 10-2020-0022156 | A | | 3/2020 | |
| KR | 10-2020-0042738 | A | | 4/2020 | |
| KR | 10-2021-0016216 | A | | 2/2021 | |
| KR | 20210074454 | A | * | 6/2021 | ......... H01L 23/5389 |

* cited by examiner

FIG. 1

START

FORMING AN ADHESIVE LAYER ON A SEMICONDUCTOR CHIP — S110

MOUNTING THE SEMICONDUCTOR CHIP ON A FIRST WAFER — S120

BONDING A SECOND WAFER ON THE FIRST WAFER
AND THE SEMICONDUCTOR CHIP — S130

FORMING A MOLDING LAYER BETWEEN THE FIRST WAFER
AND THE SECOND WAFER — S140

CUTTING THE FIRST WAFER, THE MOLDING LAYER AND
THE SECOND WAFER TO FORM A SEMICONDUCTOR PACKAGE — S150

END

DR2
DR1

DR2
DR1

METHOD OF FABRICATING SEMICONDUCTOR PACKAGE

CROSS-REFERENCE TO RELATED APPLICATION

This application claims priority from Korean Patent Application No. 10-2022-0089476 filed on Jul. 20, 2022 in the Korean Intellectual Property Office, the contents of which being herein incorporated by reference in its entirety.

BACKGROUND

The present disclosure relates to a method of fabricating a semiconductor package.

Recently, as high-performance devices are increasingly being required, not only the size of semiconductor chips, but also the size of semiconductor packages, is increasing accordingly. On the contrary, as electronic devices have become slimmer, the thickness of semiconductor packages has decreased.

Meanwhile, semiconductor packages are increasingly developed to meet requirements such as multiple functionality, high capacity, compactness, and small size. To this end, a technique has been suggested in which multiple semiconductor chips are integrated into a single semiconductor package to considerably reduce the size of the semiconductor package and to allow the semiconductor package to provide high capacity and multifunctionality.

SUMMARY

It is an aspect to provide a method of fabricating a semiconductor package, which can prevent an upper wafer from being peeled off due to the absence of a molding layer between a semiconductor chip and the upper layer, by forming an adhesive layer between a semiconductor chip and the upper wafer and forming the molding layer between a lower wafer and the upper wafer to surround the sidewalls of the adhesive layer.

According to an aspect of one or more embodiments, there is provided a method comprising providing a semiconductor chip having solder balls formed on a bottom surface thereof; forming an adhesive layer on a top surface of the semiconductor chip; mounting the semiconductor chip on a first wafer using the solder balls; bonding a second wafer to the first wafer and to the adhesive layer of the semiconductor chip that is mounted on the first wafer; forming a molding layer between the first wafer and the second wafer; and cutting the first wafer, the molding layer and the second wafer.

According to another aspect of one or more embodiments, there is provided a method comprising providing a semiconductor chip having solder balls formed on a bottom surface thereof; forming an adhesive layer on a top surface of the semiconductor chip; mounting the semiconductor chip on a first wafer using the solder balls; bonding a second wafer to the first wafer and to the adhesive layer on the semiconductor chip that is mounted on the first wafer; and forming a molding layer between the first wafer and the second wafer, wherein the bonding comprises pressing the adhesive layer such that, after the bonding, a width of the adhesive layer in a horizontal direction is greater than a width of the semiconductor chip in the horizontal direction.

According to yet another aspect of one or more embodiments, there is provided a method comprising providing a semiconductor chip having solder balls formed on a bottom surface thereof; forming an adhesive layer on a top surface of the semiconductor chip; mounting the semiconductor chip on a first wafer using the solder balls; bonding a second wafer to the first wafer and to the adhesive layer on the semiconductor chip that is mounted on the first wafer; and forming a molding layer between the first wafer and the second wafer, wherein the bonding comprises pressing the adhesive layer such that, after the bonding, a width of the adhesive layer in a horizontal direction is greater than a width of the semiconductor chip in the horizontal direction.

BRIEF DESCRIPTION OF THE DRAWINGS

The above and other aspects will become more apparent by describing in detail exemplary embodiments thereof with reference to the attached drawings, in which:

FIG. 1 is a cross-sectional view of a semiconductor package obtained by a method of fabricating a semiconductor package according to some embodiments;

DETAILED DESCRIPTION

Figure 2:
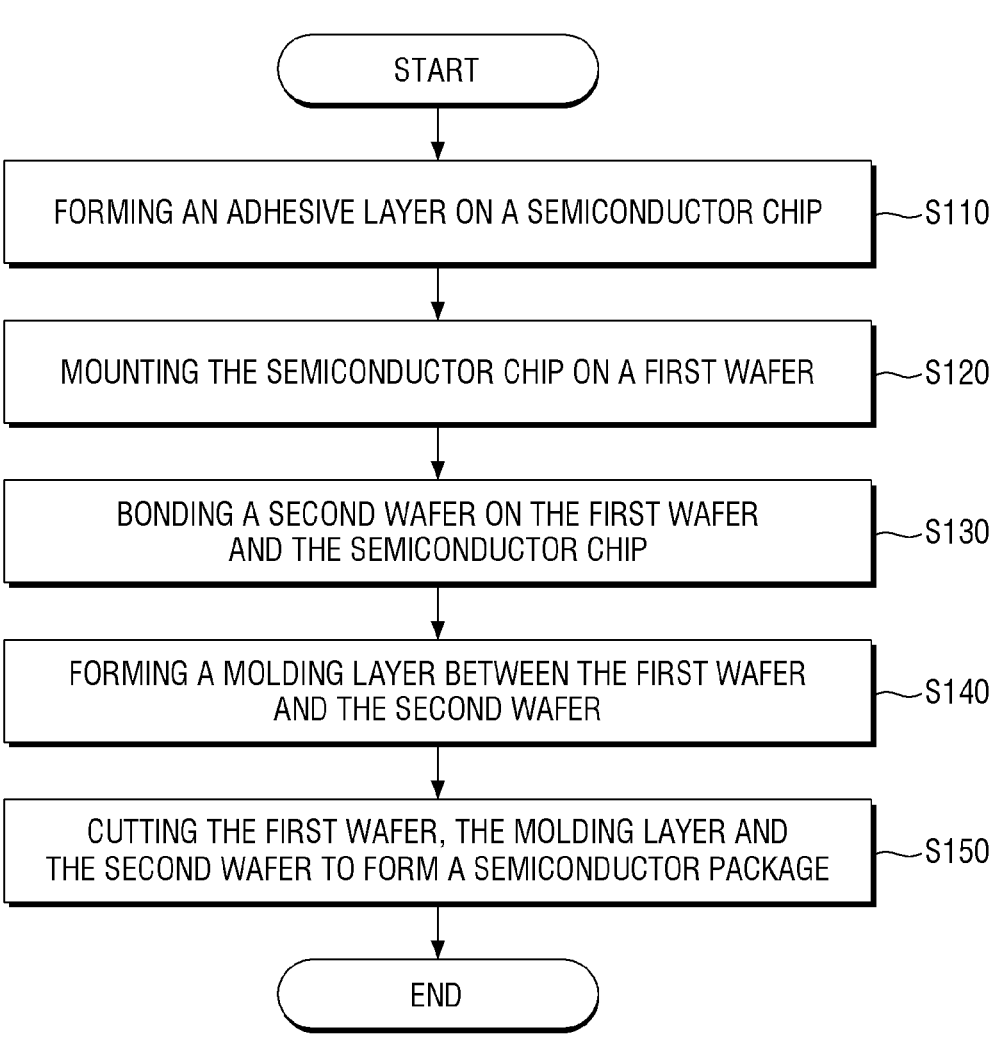
FIG. 2 is a flowchart illustrating the method of fabricating a semiconductor package according to some embodiments.

A semiconductor package obtained by a method of fabricating a semiconductor package according to some embodiments will hereinafter be described with reference to FIG. 1.

Figure 1:
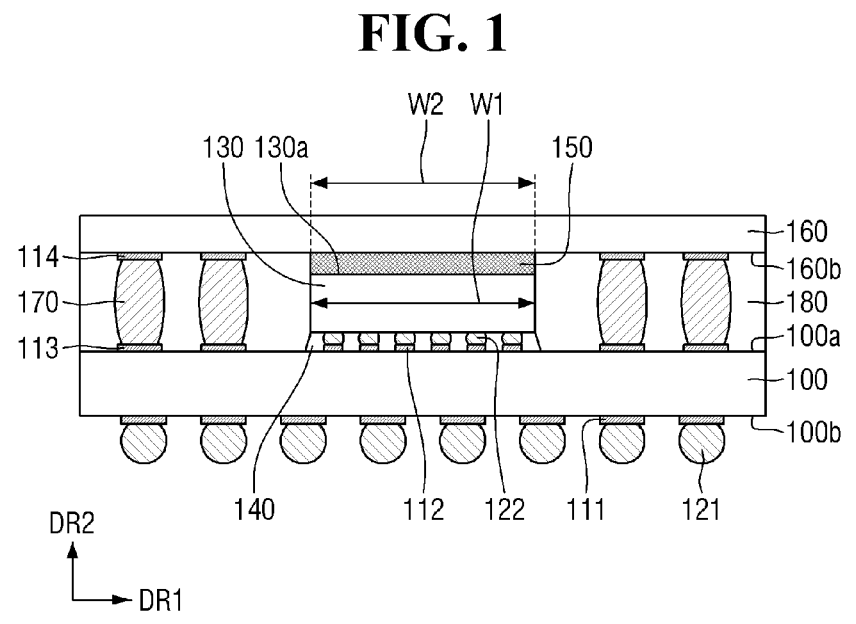

FIG. 1 is a cross-sectional view of a semiconductor package obtained by a method of fabricating a semiconductor package according to some embodiments.

Referring to FIG. 1, the semiconductor package includes a substrate 100, first conductive terminals 111, second conductive terminals 112, third conductive terminals 113, fourth conductive terminals 114, first solder balls 121, second solder balls 122, a semiconductor chip 130, an underfill member 140, an adhesive layer 150, an interposer 160, connectors 170, and a molding layer 180.

The substrate 100 may be, for example, a printed circuit board (PCB) or a ceramic substrate, but embodiments are not limited thereto. In a case where the substrate 100 is a PCB, the substrate 100 may be formed of at least one selected from among a phenolic resin, an epoxy resin, and polyimide. For example, the substrate 100 may include at least one selected from among FR4, tetrafunctional epoxy, polyphenylene ether, epoxy/polyphenylene oxide, bismaleimide triazine (BT), Thermount, cyanate ester, polyimide, and a liquid crystal polymer.

The substrate 100 may have a first surface 100a and a second surface 100b, which is opposite to the first surface 100a. For example, the first surface 100a of the substrate 100 may be defined as the top surface of the substrate 100, and the second surface 100b of the substrate 100 may be defined as the bottom surface of the substrate 100.

The first conductive terminals 111 may be disposed on the second surface 100b of the substrate 100. For example, the first conductive terminals 111 may protrude from the second surface 100b of the substrate 100, but embodiments are not limited thereto. In some embodiments, the first conductive terminals 111 may be buried in the substrate 100. In this case, at least parts of the first conductive terminals 111 may be exposed on the substrate 100. The first conductive terminals 111 may include a conductive material.

The second conductive terminals 112 may be disposed on the first surface 100a of the substrate 100. For example, the second conductive terminals 112 may be disposed in the middle of the first surface 100a of the substrate 100. For example, the second conductive terminals 112 may protrude from the first surface 100a of the substrate 100, but embodiments are not limited thereto. In some embodiments, the second conductive terminals 112 may be buried in the substrate 100. In this case, at least parts of the second conductive terminals 112 may be exposed on the substrate 100. The second conductive terminals 112 may include a conductive material.

The third conductive terminals 113 may be disposed on the first surface 100a of the substrate 100. For example, the third conductive terminals 113 may be disposed along the edges of the first surface 100a of the substrate 100. For example, the third conductive terminals 113 may protrude from the first surface 100a of the substrate 100, but embodiments are not limited thereto. In some embodiments, the third conductive terminals 113 may be buried in the substrate 100. In this case, at least parts of the third conductive terminals 113 may be exposed on the substrate 100. The third conductive terminals 113 may include a conductive material.

The first solder balls 121 may be disposed on the second surface 100b of the substrate 100. The first solder balls 121 may be connected to the first conductive terminals 111. The first solder balls 121 may protrude from the second surface 100b of the substrate 100. The first solder balls 121 may be parts of the substrate 100 that are electrically connected to external elements. The second solder balls 122 may be disposed on the first surface 100a of the substrate 100. The second solder balls 122 may be connected to the second conductive terminals 112. The second solder balls 122 may protrude from the first surface 100a of the substrate 100.

The first solder balls 121 and the second solder balls 122 may include at least one of, for example, tin (Sn), indium (In), lead (Pb), zinc (Zn), nickel (Ni), gold (Au), silver (Ag), copper (Cu), antimony (Sb), bismuth (Bi), or a combination thereof, but embodiments are not limited thereto.

The semiconductor chip 130 may be disposed on the first surface 100a of the substrate 100. The semiconductor chip 130 may be connected to the second solder balls 122. The semiconductor chip 130 may be electrically connected to the substrate 100 via the second solder balls 122 and the second conductive terminals 112. In some embodiments, the semiconductor chip 130 may be, for example, a logic semiconductor chip. In some embodiments, the semiconductor chip 130 may be a microprocessor. In some embodiments, the semiconductor chip 130 may be, for example, a central processing unit (CPU), a controller, or an application-specific integrated circuit (ASIC). In some embodiments, the semiconductor chip 130 may be, for example, a memory semiconductor chip.

The underfill member 140 may be disposed between the first surface 100a of the substrate 100 and the bottom surface of the semiconductor chip 130. The underfill member 140 may surround the sidewalls of each of the second solder balls 122 and the sidewalls of each of the second conductive terminals 112. For example, the underfill member 140 may protrude in a horizontal direction DR1 from the sidewalls of the semiconductor chip 130, but embodiments are not limited thereto. Here, the horizontal direction DR1 may be defined as a direction parallel to the first surface 100a of the substrate 100. The underfill member 140 may include an insulating polymer material such as, for example, an epoxy molding compound (EMC), but embodiments are not limited thereto.

The interposer 160 may be disposed on the first surface 100a of the substrate 100 and a top surface 130a of the semiconductor chip 130. For example, a bottom surface 160b of the interposer 160 may be spaced apart from the top surface 130a of the semiconductor chip 130 in a vertical direction DR2. Here, the vertical direction DR2 may be defined as a direction perpendicular to the first surface 100a of the substrate 100. That is, the vertical direction DR2 may be perpendicular to the horizontal direction DR1.

The interposer 160 may include, for example, silicon. In some embodiments, the interposer 160 may include at least one of, for example, glass, ceramic, or plastic. In some embodiments, the interposer 160 may function as a redistribution layer. In this case, the interposer 160 may be formed of at least one of a phenolic resin, an epoxy resin, or a polyimide.

The fourth conductive terminals 114 may be disposed on the bottom surface 160b of the interposer 160. For example, the fourth conductive terminals 114 may be disposed along the edges of the bottom surface 160b of the interposer 160. The fourth conductive terminals 114 may overlap with the third conductive terminals 113 in the vertical direction DR2.

For example, the fourth conductive terminals 114 may protrude from the bottom surface 160b of the interposer 160, but embodiments are not limited thereto. In some embodiments, the fourth conductive terminals 114 may be buried in the interposer 160. In this case, at least parts of the fourth conductive terminals 114 may be exposed on the interposer 160. The fourth conductive terminals 114 may include a conductive material.

The connectors 170 may be disposed between the first surface 100a of the substrate 100 and the bottom surface 160b of the interposer 160. The connectors 170 may connect the third conductive terminals 113 and the fourth conductive terminals 114. The interposer 160 may be electrically connected to the substrate 100 via the connectors 170. The connectors 170 may be spaced apart from the semiconductor chip 130 in the horizontal direction DR1. The connectors 170 may include a conductive material.

The adhesive layer 150 may be disposed between the top surface 130a of the semiconductor chip 130 and the bottom surface 160b of the interposer 160. The adhesive layer 150 may be in contact with the top surface 130a of the semiconductor chip 130 and the bottom surface 160b of the interposer 160. For example, a width W2, in the horizontal direction DR1, of the adhesive layer 150 may be the same as a width W1, in the horizontal direction DR1, of the semiconductor chip 130, but embodiments are not limited thereto. For example, the sidewalls of the adhesive layer 150 may be aligned with the sidewalls of the semiconductor chip 130 in the vertical direction DR2, but embodiments are not limited thereto. In other words, in some embodiments, the sidewalls of the adhesive layer 150 may be coplanar with the sidewalls of the semiconductor chip 130 in the vertical direction DR2. For example, a thickness, in the vertical direction DR2, of the adhesive layer 150 may be 10 μm to 100 μm.

The adhesive layer 150 may bond the interposer 160 onto the top surface 130a of the semiconductor chip 130. The adhesive layer 150 may include at least one organic resin such as, for example, an epoxy resin, an acrylic resin, a polyester resin, and/or polycarbonate, but embodiments are not limited thereto.

The molding layer 180 may be disposed between the top surface 130a of the semiconductor chip 130 and the bottom surface 160b of the interposer 160. The molding layer 180 may surround the sidewalls of the underfill member 140, the sidewalls of the semiconductor chip 130, the sidewalls of the adhesive layer 150, and the sidewalls of each of the connectors 170. For example, the sidewalls of the molding layer 180 may be aligned with the sidewalls of the substrate 100 and the sidewalls of the interposer 160 in the vertical direction DR2. The molding layer 180 may include, for example, an EMC or a silicone hybrid material including two or more types of materials, but embodiments are not limited thereto.

A method of fabricating a semiconductor package according to some embodiments will hereinafter be described with reference to FIGS. 2 through 10.

Figure 3:
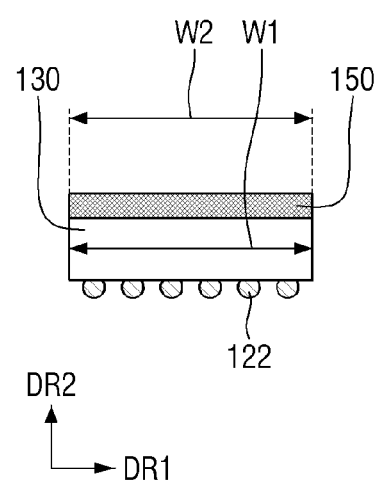
FIGS. 3 through 10 are cross-sectional views illustrating the method of fabricating a semiconductor package according to some embodiments.

Referring to FIGS. 2 and 3, a semiconductor chip 130 having second solder balls 122 formed on the bottom surface thereof may be provided. Thereafter, an adhesive layer 150 may be formed on the top surface of the semiconductor chip 130 (S110). For example, a width W2, in a horizontal direction DR1, of the adhesive layer 150 may be the same as a width W1, in the horizontal direction DR1, of the semiconductor chip 130. That is, the sidewalls of the adhesive layer 150 may be aligned with the sidewalls of the semiconductor chip 130 in a vertical direction DR2. For example, in some embodiments, the sidewalls of the adhesive layer 150 may be coplanar with the sidewalls of the semiconductor chip 130 in the vertical direction DR2.

For example, after the formation of an adhesive layer 150 on an entire wafer where a plurality of semiconductor chips 130 are formed, individual adhesive layers 150 having the same width in the horizontal direction DR1 as the semiconductor chips 130 may be obtained by a sawing process.

Figure 4:
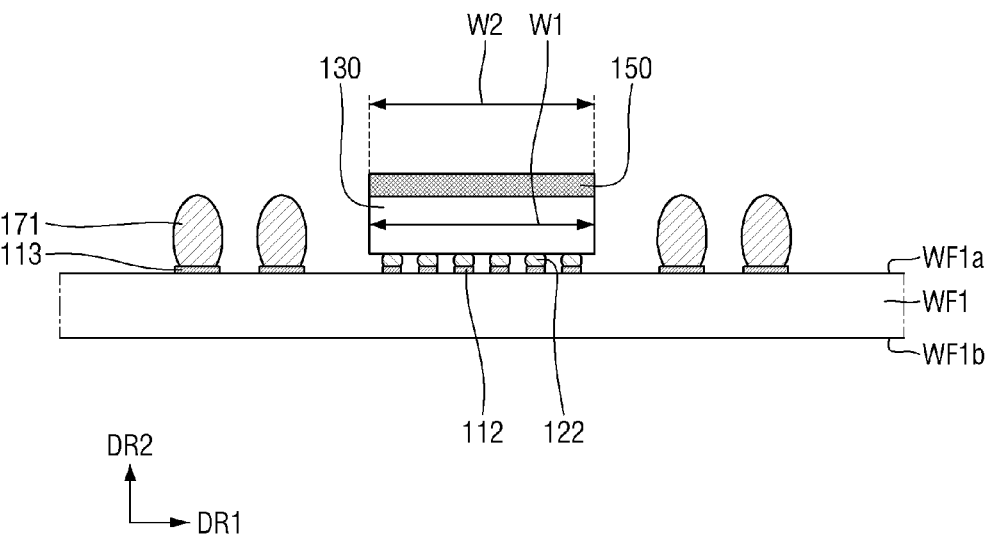

Referring to FIGS. 2 and 4, a first wafer WF1 having a first surface WF1a and a second surface WF1b, which is opposite to the first surface WF1a, may be provided. For example, the first surface WF1a of the first wafer WF1 may be defined as the top surface of the first wafer WF1, and the second surface WF1b of the first wafer WF1 may be defined as the bottom surface of the first wafer WF1. For example, the first wafer WF1 may be a wafer including printed circuitry therein.

Second conductive terminals 112 may be formed in the middle of the first surface WF1a of the first wafer WF1. Third conductive terminals 113 may be formed along the edges of the first surface WF1a of the first wafer WF1. That is, the third conductive terminals 113 may be formed at outside region of a region on which the second conductive terminals 112 are formed. Thereafter, first connectors 171 may be formed on the third conductive terminals 113. The first connectors 171 may protrude from the third conductive terminals 113. The first connectors 171 may include a conductive material.

Thereafter, the semiconductor chip 130 may be mounted on the first surface WF1a of the first wafer WF1 (S120). For example, the second solder balls 122 of the semiconductor chip 130 may be connected to the second conductive terminals 112 on the first surface WF1a of the first wafer WF1. That is, the semiconductor chip 130 may be mounted on the first surface WF1a of the first wafer WF1 via the second solder balls 122.

Figure 5:
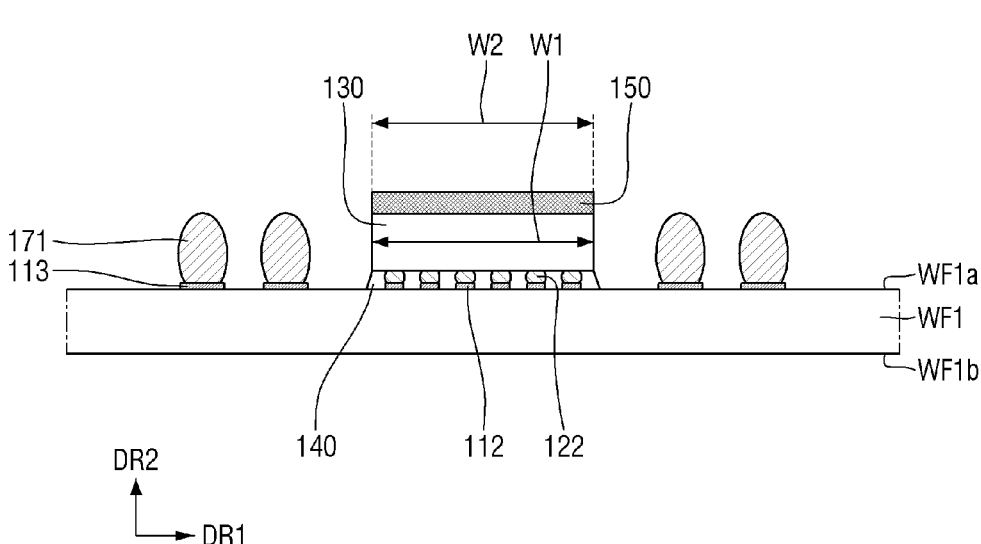

Referring to FIG. 5, an underfill member 140 may be formed between the first surface WF1a of the first wafer WF1 and the bottom surface of the semiconductor chip 130. The underfill member 140 may surround the sidewalls of each of the second solder balls 122. For example, the underfill member 140 may surround the second conductive terminals 112 that are exposed.

Figure 6:
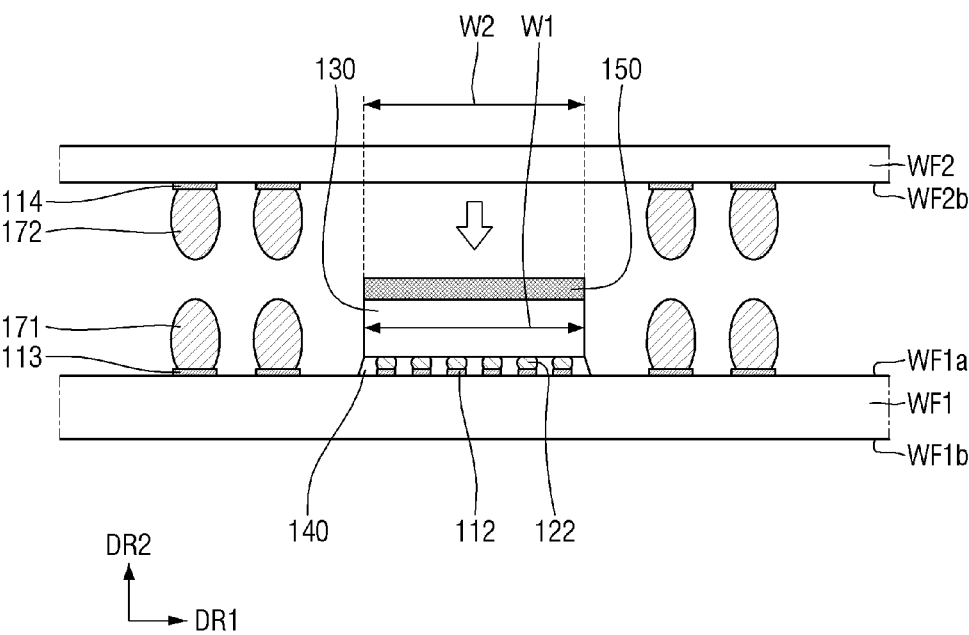
Figure 7:
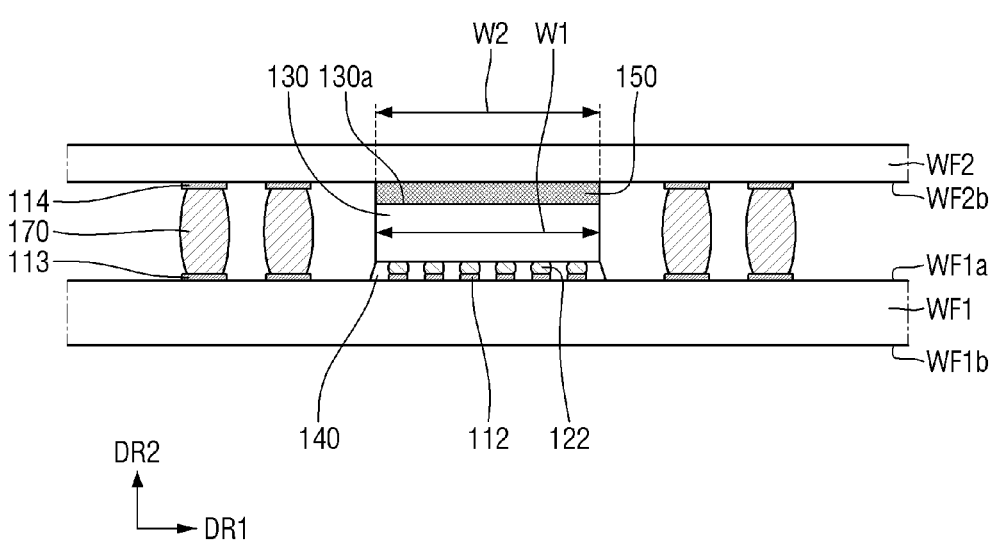

Referring to FIGS. 2, 6, and 7, a second wafer WF2 may be bonded onto the first surface WF1a of the first wafer WF1 and the top surface 130a of the semiconductor chip 130 (S130). For example, the second wafer WF2 may include, for example, silicon. In some embodiments, the second wafer WF2 may include at least one of, for example, glass, ceramic, or plastic. In some embodiments, the second wafer WF2 may include a redistribution layer formed therein.

Fourth conductive terminals 114 may be formed along the edges of a bottom surface WF2b of the second wafer WF2. The bottom surface WF2b of the second wafer WF2 may be defined as a surface of the second wafer WF2 that faces the first surface WF1a of the first wafer WF1. Thereafter, second connectors 172 may be formed on the fourth conductive terminals 114. The second connectors 172 may protrude from the fourth conductive terminals 114. The second connectors 172 may include a conductive material.

Thereafter, the second wafer WF2 may be bonded to the first wafer WF1 and the semiconductor chip 130. For example, the second connectors 172 may be connected to the first connectors 171. The first connectors 171 and the second connectors 172 may be connected to one another, thereby forming connectors 170. A portion of the bottom surface WF2b of the second wafer WF2 between the second connectors 172 may be bonded onto the top surface of the adhesive layer 150. For example, in a state where the second wafer WF2 is bonded to the adhesive layer 150, the width W2, in the horizontal direction DR1, of the adhesive layer 150 may be the same as the width W1, in the horizontal direction DR1, of the semiconductor chip 130. In some embodiments, in the state where the second wafer WF2 is bonded to the adhesive layer 150, sidewalls of the adhesive layer 150 may be coplanar with sidewalls of the semiconductor chip 130.

Figure 8:
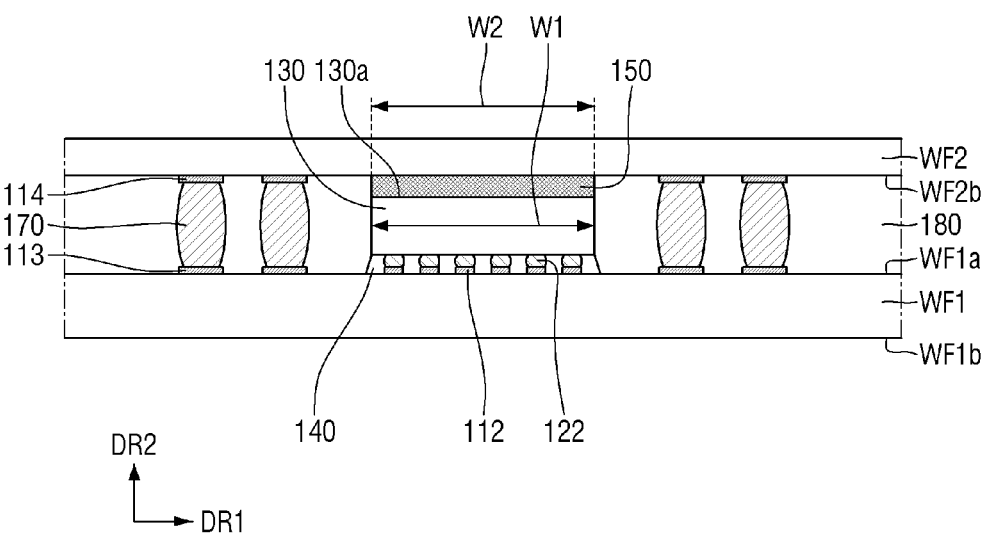

Referring to FIGS. 2 and 8, a molding layer 180 may be formed between the first surface WF1a of the first wafer WF1 and the bottom surface WF2b of the second wafer WF2 (S140). The molding layer 180 may surround the sidewalls of the underfill member 140, the sidewalls of the semiconductor chip 130, the sidewalls of the adhesive layer 150, and the sidewalls of each of the connectors 170. For example, the molding layer 180 may completely fill the gap between the first surface WF1a of the first wafer WF1 and the bottom surface WF2b of the second wafer WF2.

In some embodiments, the adhesive layer 150 may be formed between the semiconductor chip 130 and the second wafer WF2, and the molding layer 180 may be formed between the first and second wafers WF1 and WF2 to surround the sidewalls of the adhesive layer 150. In this manner, the second wafer WF2 can be prevented from being peeled off because of the absence of the molding layer 180 between the semiconductor chip 130 and the second wafer WF2.

Figure 9:
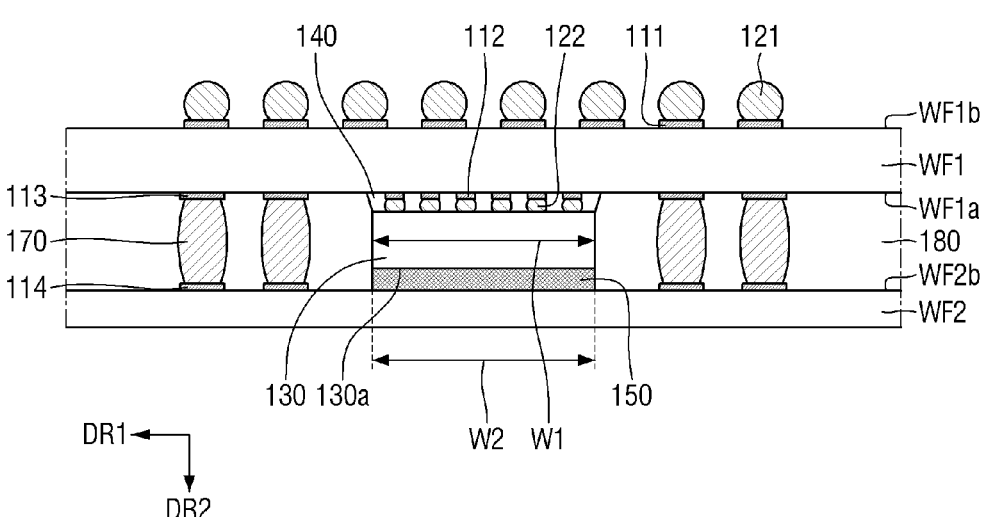

Referring to FIG. 9, the structure illustrated in FIG. 8 may be turned upside down. Thereafter, first conductive terminals 111 may be formed on the second surface WF1*b* of the first wafer WF1. Thereafter, first solder balls 121 may be formed on the first conductive terminals 111. The first solder balls 121 may protrude from the first conductive terminals 111.

Figure 10:
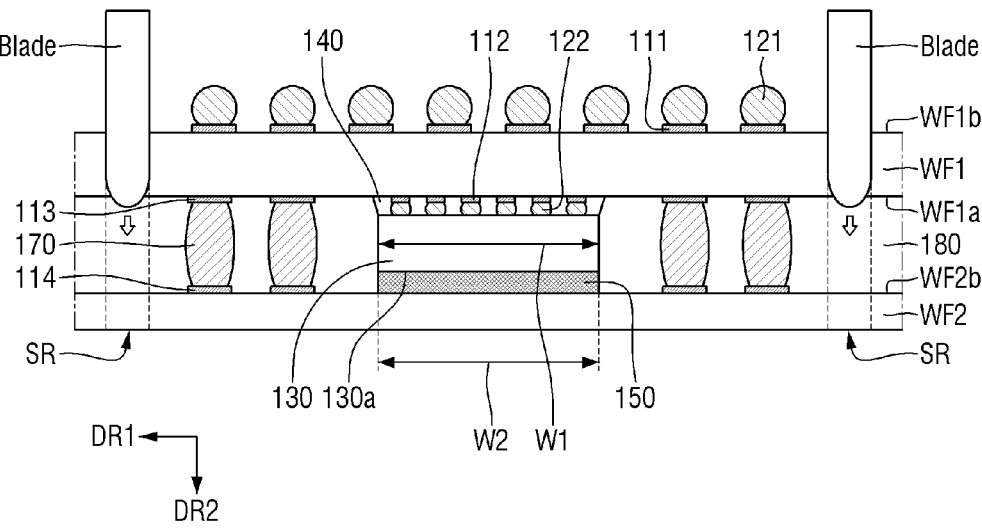

Referring to FIGS. 2 and 10, the semiconductor package of FIG. 1 may be obtained by cutting the first wafer WF1, the molding layer 180, and the second wafer WF2 (S150). For example, a sawing process may be performed along scribe regions SR. For example, the sawing process may be performed using blades, but embodiments are not limited thereto.

For example, the sidewalls of the cut first wafer WF1, the sidewalls of the cut molding layer 180, and the sidewalls of the cut second wafer WF2 may be aligned with one another in the vertical direction DR2. That is, after the sawing process, the sidewalls of the cut first wafer WF1, the sidewalls of the cut molding layer 180, and the sidewalls of the cut second wafer WF2 may be coplanar with each other. After the sawing process, the first wafer WF1 may be defined as the substrate 100 of FIG. 1, and the second wafer WF2 may be defined as the interposer 160 of FIG. 1.

A method of fabricating a semiconductor package according to some embodiments will hereinafter be described with reference to FIGS. 11 through 13. The embodiment of FIGS. 11 through 13 will hereinafter be described, focusing mainly on the differences with the embodiment of FIGS. 2 through 10.

Figure 11:
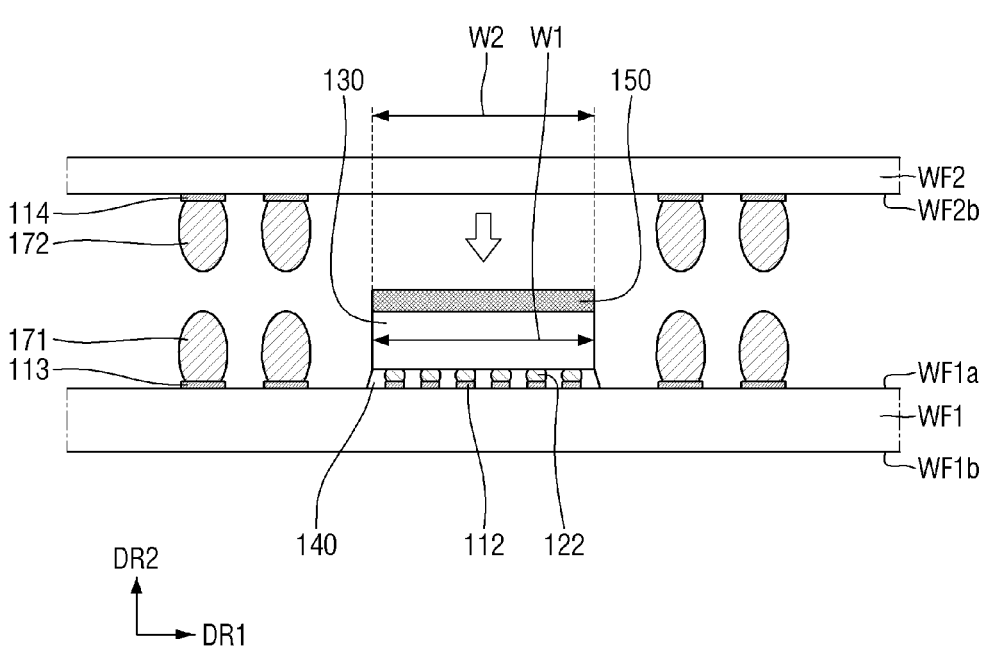
FIGS. 11 through 13 are cross-sectional views illustrating a method of fabricating a semiconductor package according to some embodiments.
Figure 12:
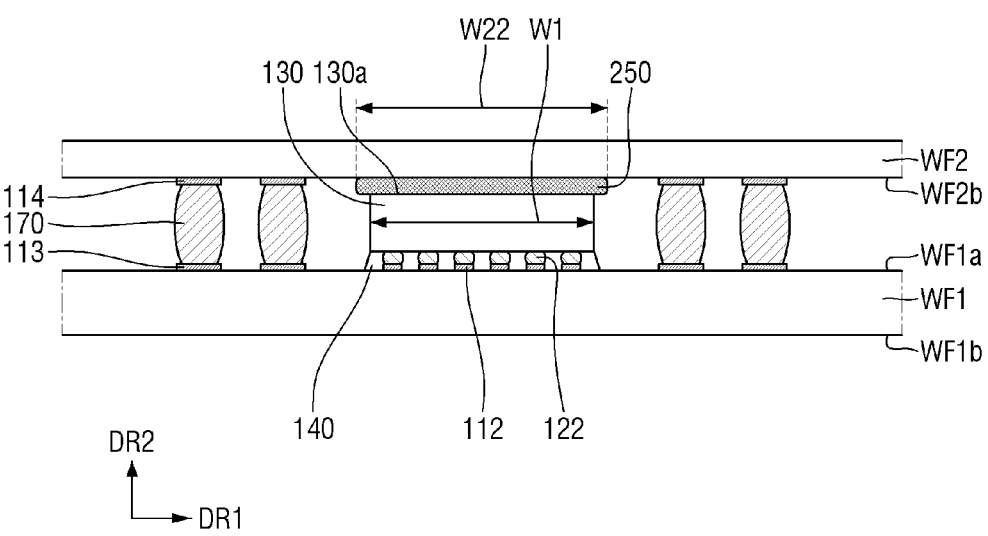

Referring to FIGS. 11 and 12, after the processes illustrated in FIG. 3 through a second wafer WF2 may be bonded onto a first surface WF1*a* of a first wafer WF1 and a top surface 130*a* of a semiconductor chip 130.

For example, during the bonding of the second wafer WF2, an adhesive layer 150 of FIG. 11 may be pressed against the second wafer WF2 and may thus be transformed into an adhesive layer 250 of FIG. 12. For example, the thickness, in a vertical direction DR2, of the adhesive layer 250 may be less than the thickness, in the vertical direction DR2, of the adhesive layer 150.

For example, at least part of the adhesive layer 250 may protrude laterally beyond the sidewalls of the semiconductor chip 130. That is, at least part of the adhesive layer 250 may not overlap with the semiconductor chip 130 in the vertical direction DR2. For example, a width W22, in a horizontal direction DR1, of the adhesive layer 250 may be greater than a width W1, in the horizontal direction DR1, of the semiconductor chip 130.

Figure 13:
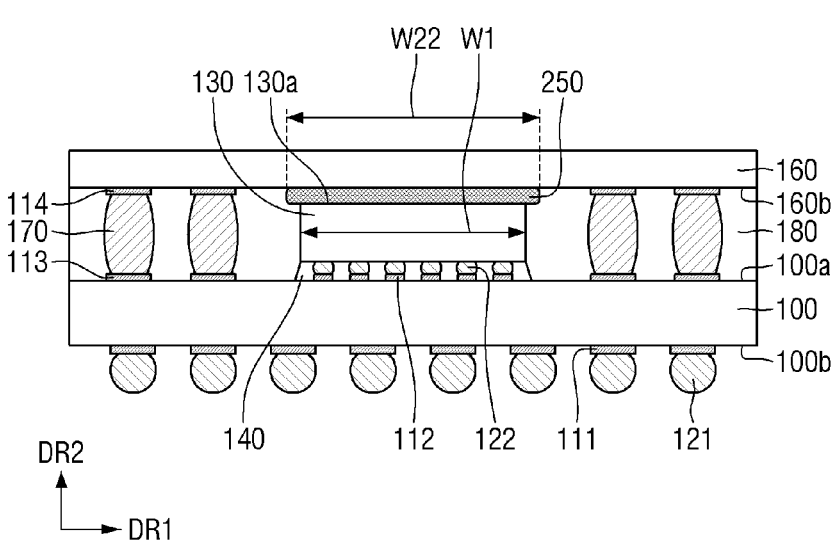

Referring to FIG. 13, a molding layer 180 may be formed between the first surface WF1*a* of the first wafer WF1 and a bottom surface WF2*b* of the second wafer WF2. For example, at least part of the bottom surface of the adhesive layer 250 may be in contact with the molding layer 180. Thereafter, first conductive terminals 111 and first solder balls 121 may be formed on the second surface WF1*b* of the first wafer WF1. Thereafter, the first wafer WF1, the molding layer 180, and the second wafer WF2 may be cut, thereby obtaining a semiconductor package of FIG. 13.

A method of fabricating a semiconductor package according to some embodiments will hereinafter be described with reference to FIGS. 14 through 16. The embodiment of FIGS. 14 through 16 will hereinafter be described, focusing mainly on the differences with the embodiment of FIGS. 2 through 10.

Figure 14:
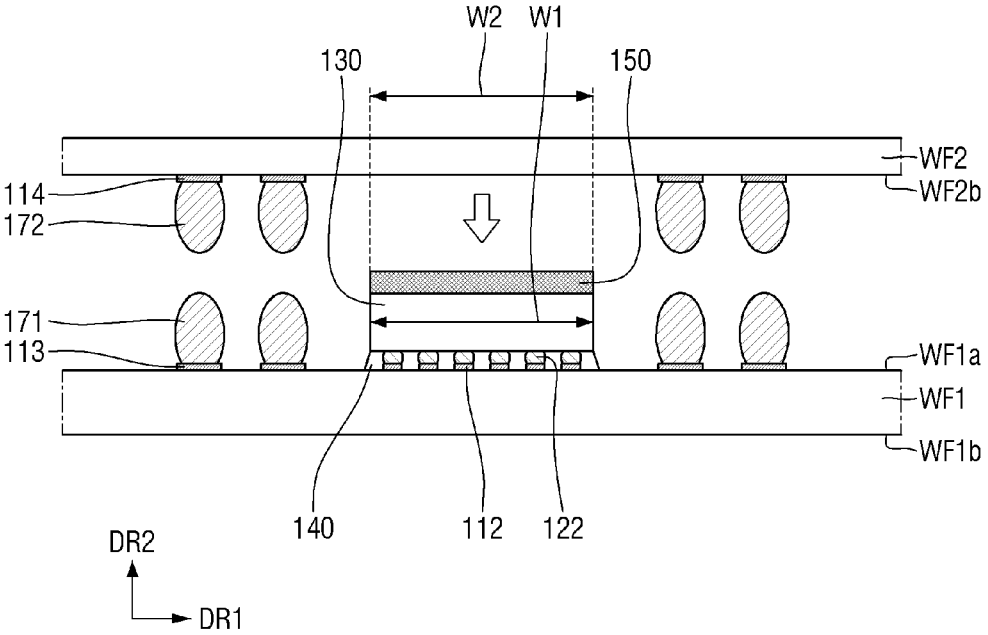
FIGS. 14 through 16 are cross-sectional views illustrating a method of fabricating a semiconductor package according to some embodiments.
Figure 15:
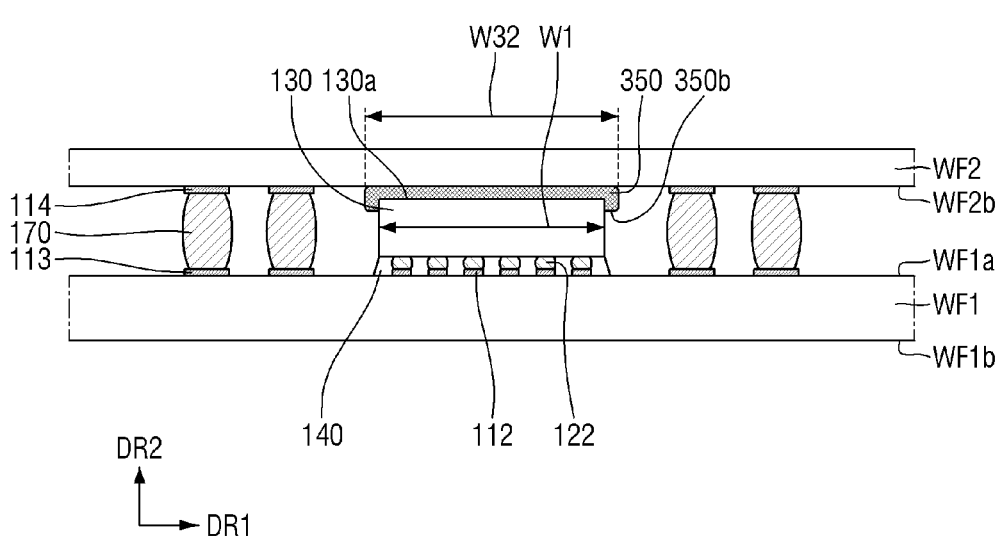

Referring to FIGS. 14 and 15, after the processes illustrated in FIG. 3 through a second wafer WF2 may be bonded onto a first surface WF1*a* of a first wafer WF1 and a top surface 130*a* of a semiconductor chip 130.

For example, during the bonding of the second wafer WF2, an adhesive layer 150 of FIG. 14 may be pressed against the second wafer WF2 and may thus be transformed into an adhesive layer 350 of FIG. 15. For example, the thickness, in a vertical direction DR2, of the adhesive layer 350 on the top surface 130*a* of the semiconductor chip 130 may be less than the thickness, in the vertical direction DR2, of the adhesive layer 150 as illustrated, for example, in FIG. 7.

For example, at least a portion of the adhesive layer 350 may protrude laterally beyond the sidewalls of the semiconductor chip 130. That is, at least a portion of the adhesive layer 350 may not overlap with the semiconductor chip 130 in the vertical direction DR2. For example, at least a portion of the adhesive layer 350 may be formed on the sidewalls of the semiconductor chip 130. For example, at least a portion of the adhesive layer 350 may be in contact with the sidewalls of the semiconductor chip 130.

For example, a lowermost surface 350*b* of the adhesive layer 350 may be formed to be lower than the top surface 130*a* of the semiconductor chip 130. In other words, the lowermost surface 350*b* of the adhesive layer 350 may not be coplanar with the top surface 130*a* of the semiconductor chip 130. That is, the lowermost surface 350*b* of the adhesive layer 350 may be formed to be closer than the top surface 130*a* of the semiconductor chip 130 to the first surface WF1*a* of the first wafer WF1. For example, a width W32, in a horizontal direction DR1, of the adhesive layer 350 may be greater than a width W1, in the horizontal direction DR1, of the semiconductor chip 130.

Figure 16:
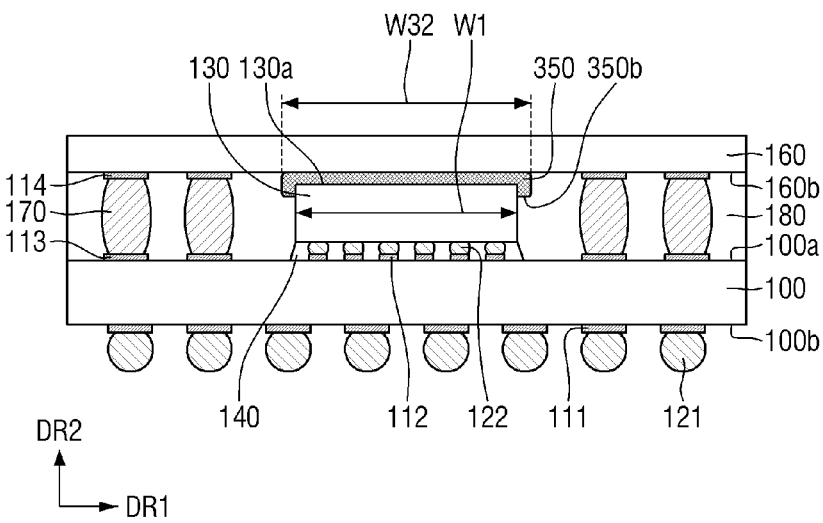

Referring to FIG. 16, a molding layer 180 may be formed between the first surface WF1*a* of the first wafer WF1 and a bottom surface WF2*b* of the second wafer WF2. For example, a lowermost surface 350*b* of the adhesive layer 350 may be in contact with the molding layer 180. Thereafter, first conductive terminals 111 and first solder balls 121 may be formed on the second surface WF1*b* of the first wafer WF1. Thereafter, the first wafer WF1, the molding layer 180, and the second wafer WF2 may be cut, thereby obtaining a semiconductor package of FIG. 16.

A method of fabricating a semiconductor package according to some embodiments will hereinafter be described with reference to FIGS. 17 through 19. The embodiment of FIGS. 17 through 19 will hereinafter be described, focusing mainly on the differences with the embodiment of FIGS. 2 through 10.

Figure 17:
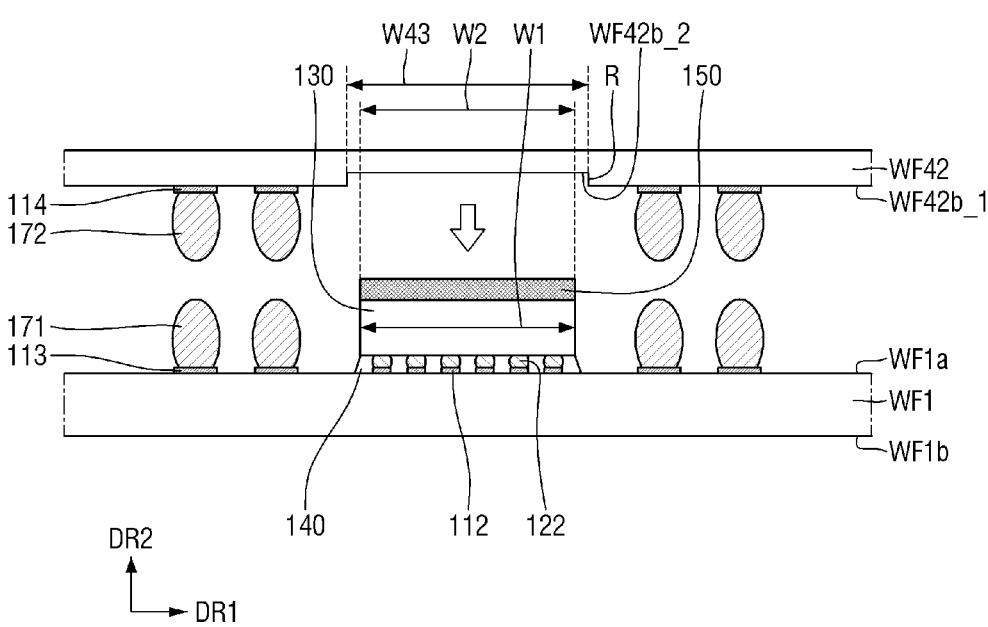
FIGS. 17 through 19 are cross-sectional views illustrating a method of fabricating a semiconductor package according to some embodiments.
Figure 18:
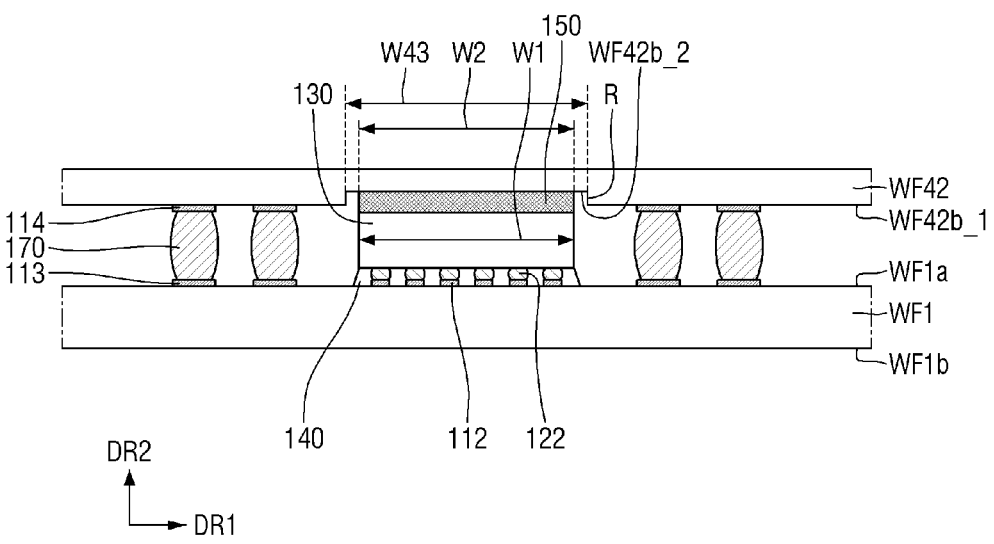

Referring to FIGS. 17 and 18, after the processes illustrated in FIG. 3 through a second wafer WF42 may be bonded onto a first surface WF1*a* of a first wafer WF1 and a top surface 130*a* of a semiconductor chip 130.

A recess R may be formed in the bottom surface of the second wafer WF42. The recess R may be formed to be recessed from a first bottom surface WF42*b*_1 of the second wafer into the second wafer WF42. Here, the first bottom surface WF42*b*1 of the second wafer WF42 may be defined as a bottom surface of the second wafer WF42 where fourth conductive terminals 114 are formed. A portion of the bottom surface of the second wafer WF42, exposed in the recess R, may be defined as a second bottom surface WF42*b*2 of the second wafer WF42. That is, the first and second bottom surfaces WF42*b*1 and WF42*b*2 of the second wafer WF42 may have a step difference therebetween. For example, the first and second bottom surfaces WF42*b*_1 and WF42*b*_2 of the second wafer WF42 may not be coplanar.

The recess R may overlap with the semiconductor chip 130 in a vertical direction DR2. For example, a width W43, in a horizontal direction DR1, of the recess R may be greater than a width W2, in the horizontal direction DR1, of an adhesive layer 150, but embodiments are not limited thereto.

In some embodiments, the adhesive layer 150 may be bonded to the second bottom surface WF42*b*2 of the second wafer WF42, in the recess R. In a state where the second bottom surface WF42*b*_2 of the second wafer WF42 is bonded to the adhesive layer 150, the width W2, in the horizontal direction DR1, of the adhesive layer 150 may be the same as a width W1, in the horizontal direction DR1, of the semiconductor chip 130.

For example, in a state where the second bottom surface WF42*b*_2 of the second wafer WF42 is bonded to the adhesive layer 150, the sidewalls of the adhesive layer 150 may be spaced apart from the sidewalls of the recess R. That is, at least a portion of the second bottom surface WF42*b*_2 of the second wafer WF42 may be exposed on the sidewalls of the adhesive layer 150, in the recess R. For example, the top surface 130*a* of the semiconductor chip 130 may be formed to be lower than the first bottom surface WF42*b*_1 of the second wafer WF42. For example, in some embodiments, the top surface 130*a* of the semiconductor chip 130 may not be coplanar with the first bottom surface WF42*b*_1 of the second wafer WF42. That is, the top surface 130*a* of the semiconductor chip 130 may be formed to be closer than the first bottom surface WF42*b*1 of the second wafer WF42 to the first surface WF1*a* of the first wafer WF1.

Figure 19:
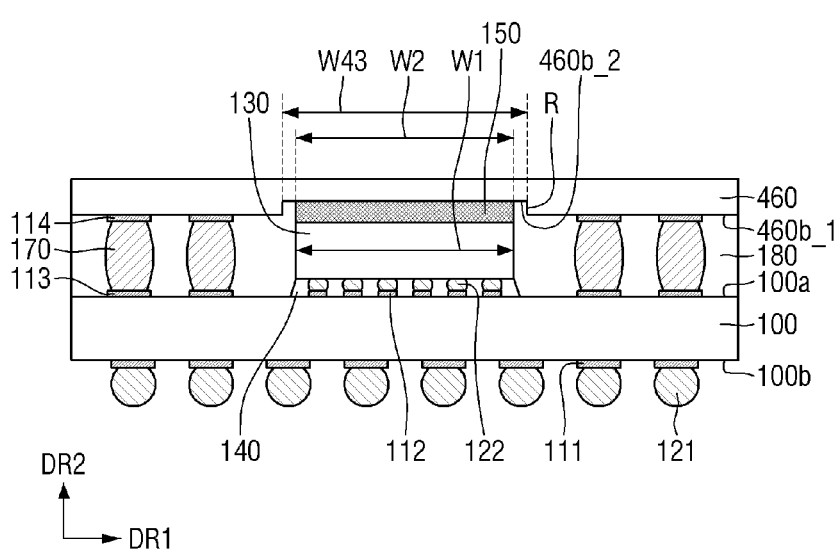

Referring to FIG. 19, a molding layer 180 may be formed between the first surface WF1*a* of the first wafer WF1 and the first and second bottom surfaces WF42*b*1 and WF42*b*_2 of the second wafer WF42. For example, the molding layer 180 may be in contact with the sidewalls of the adhesive layer 150 and the second bottom surface WF1*b* of the first wafer WF1, in the recess R. Thereafter, first conductive terminals 111 and first solder balls 121 may be formed on the second bottom surface WF42*b*_2 of the second wafer WF42. Thereafter, the first wafer WF1, the molding layer 180, and the second wafer WF42 may be cut, thereby obtaining a semiconductor package of FIG. 19.

After the sawing of the first wafer WF1, the molding layer 180, and the second wafer WF42, the first wafer WF1 may be defined as a substrate 100, the second wafer WF42 may be defined as an interposer 460, the first bottom surface WF42*b*_1 of the second wafer WF42 may be defined as a first bottom surface 460*b*_1 of the interposer 460, and the second bottom surface WF42*b*_2 of the second wafer WF42 may be defined as a second bottom surface 460*b*_2 of the interposer 460.

A method of fabricating a semiconductor package according to some embodiments will hereinafter be described with reference to FIGS. 20 through 22. The embodiment of FIGS. 20 through 22 will hereinafter be described, focusing mainly on the differences with the embodiment of FIGS. 2 through 10.

Figure 20:
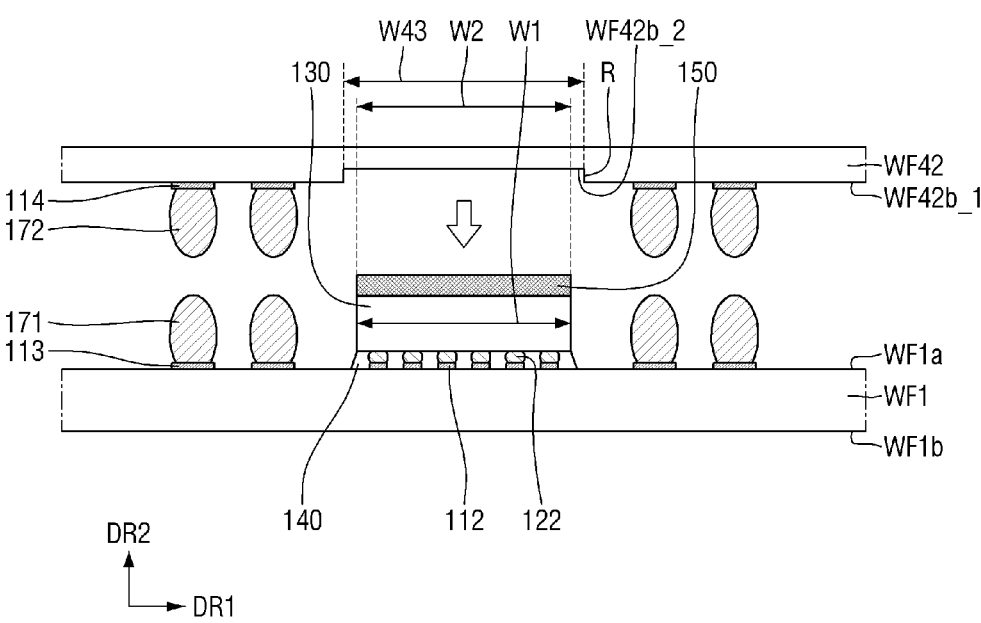
FIGS. 20 through 22 are cross-sectional views illustrating a method of fabricating a semiconductor package according to some embodiments.
Figure 21:
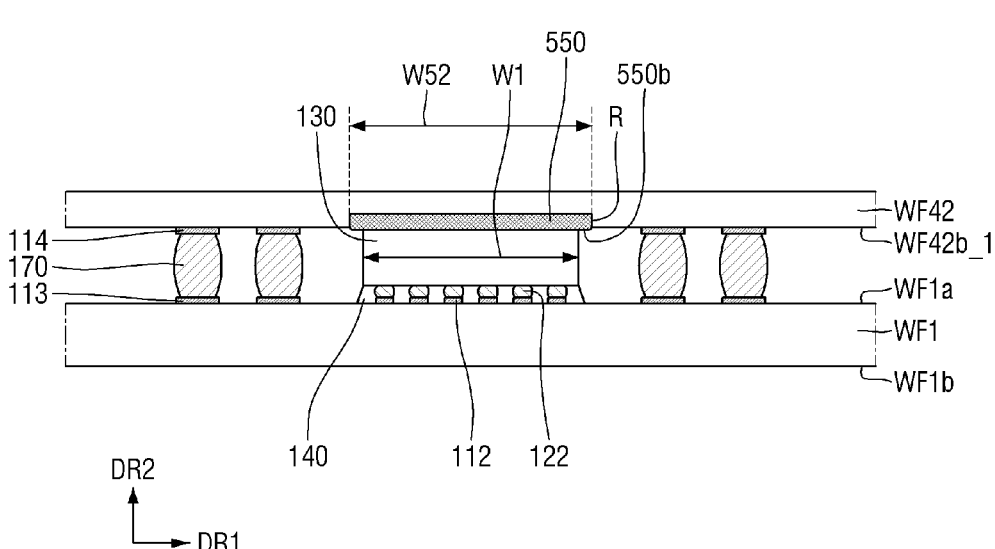

Referring to FIGS. 20 and 21, after the processes illustrated in FIGS. 3 through 5, a second wafer WF42 may be bonded onto a first surface WF1*a* of a first wafer WF1 and a top surface 130*a* of a semiconductor chip 130.

A recess R may be formed in the bottom surface of the second wafer WF42. The recess R may be formed to be recessed from a first bottom surface WF42*b*_1 of the second wafer into the second wafer WF42. Here, the first bottom surface WF42*b*1 of the second wafer WF42 may be defined as a bottom surface of the second wafer WF42 where fourth conductive terminals 114 are formed. A portion of the bottom surface of the second wafer WF42, exposed in the recess R, may be defined as a second bottom surface WF42*b*2 of the second wafer WF42. That is, the first and second bottom surfaces WF42*b*1 and WF42*b*2 of the second wafer WF42 may have a step difference therebetween. For example, the first and second bottom surfaces WF42*b*_1 and WF42*b*_2 of the second wafer WF42 may not be coplanar.

The recess R may overlap with the semiconductor chip 130 in a vertical direction DR2. For example, a width W43, in a horizontal direction DR1, of the recess R may be greater than a width W2, in the horizontal direction DR1, of an adhesive layer 150 of FIG. 20, but embodiments are not limited thereto. The width W43, in the horizontal direction DR1, of the recess R may be greater than a width W1, in the horizontal direction DR1, of the semiconductor chip 130. For example, the depth, in the vertical direction DR2, of the recess R may be less than the thickness, in the vertical direction DR2, of the adhesive layer 150 illustrated, for example, in FIG. 7, but embodiments are not limited thereto.

For example, an adhesive layer 550 of FIG. 21 may be bonded to the second bottom surface WF42*b*_2 of the second wafer WF42. For example, during the bonding of the second wafer WF2, the adhesive layer 550 may be pressed against the second bottom surface WF42*b*2 of the second wafer WF42. Thus, in a state where the second bottom surface WF42*b*_2 of the second wafer WF42 is bonded to the adhesive layer 550, a width W52, in the horizontal direction DR1, of the adhesive layer 550 may be greater than the width W1, in the horizontal direction DR1, of the semiconductor chip 130.

For example, in a state where the second bottom surface WF42*b*_2 of the second wafer WF42 is bonded to the adhesive layer 550, the adhesive layer 550 may completely fill the recess R. For example, the width W52, in the horizontal direction DR1, of the adhesive layer 550 may be the same as the width W43, in the horizontal direction Dr1, of the recess R. For example, the depth, in the vertical direction DR2, of the recess R may be less than the thickness, in the vertical direction DR2, of the adhesive layer 550, but embodiments are not limited thereto.

For example, at least a portion of the adhesive layer 550 may protrude laterally beyond the sidewalls of the semiconductor chip 130. That is, at least a portion of the adhesive layer 550 may not overlap with the semiconductor chip 130 in the vertical direction DR2.

For example, the top surface 130*a* of the semiconductor chip 130 may be formed to be lower than the first bottom surface WF42*b*_1 of the second wafer WF42. For example, in some embodiments, the top surface 130*a* of the semiconductor chip 130 may not be coplanar with the first bottom surface WF42*b*_1 of the second wafer WF42. That is, the top surface 130*a* of the semiconductor chip 130 may be formed to be closer than the first bottom surface WF42*b*1 of the second wafer WF42 to the first surface WF1*a* of the first wafer WF1, but embodiments are not limited thereto.

Figure 22:
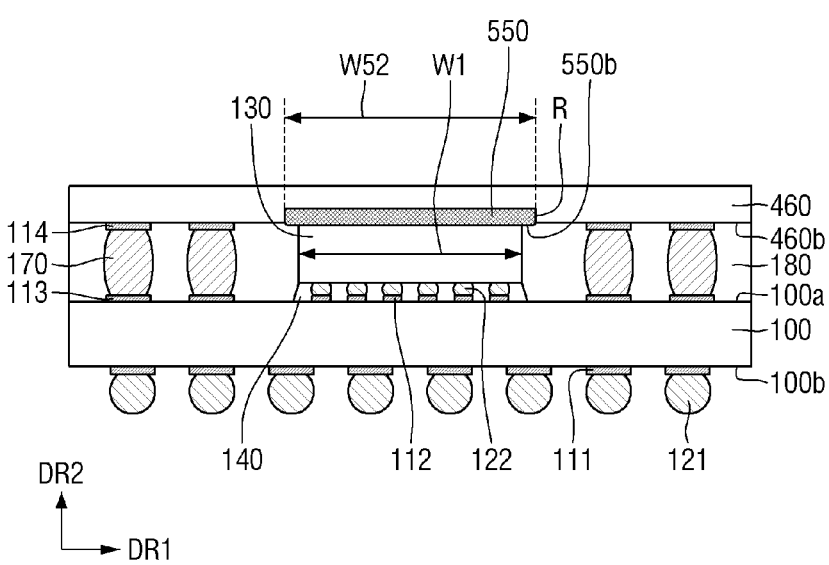

Referring to FIG. 22, a molding layer 180 may be formed between the first surface WF1*a* of the first wafer WF1 and the first and second bottom surfaces WF42*b*1 and WF42*b*_2 of the second wafer WF42. For example, at least part of a bottom surface 550*b* of the adhesive layer 550 may be in contact with the molding layer 180. For example, at least parts of the sidewalls of the adhesive layer 550 may be in contact with the molding layer 180, but embodiments are not limited thereto.

Thereafter, first conductive terminals 111 and first solder balls 121 may be formed on a second surface WF1*b* of the first wafer WF1. Thereafter, the first wafer WF1, the molding layer 180, and the second wafer WF42 may be cut, thereby obtaining a semiconductor package of FIG. 22.

After the sawing of the first wafer WF1, the molding layer 180, and the second wafer WF42, the first wafer WF1 may be defined as a substrate 100, the second wafer WF42 may be defined as an interposer 460, and the first bottom surface WF42*b*_1 of the second wafer WF42 may be defined as a first bottom surface 460*b*_1 of the interposer 460.

A method of fabricating a semiconductor package according to some embodiments will hereinafter be described with reference to FIGS. 23 through 25. The embodiment of FIGS. 23 through 25 will hereinafter be described, focusing mainly on the differences with the embodiment of FIGS. 2 through 10.

Figure 23:
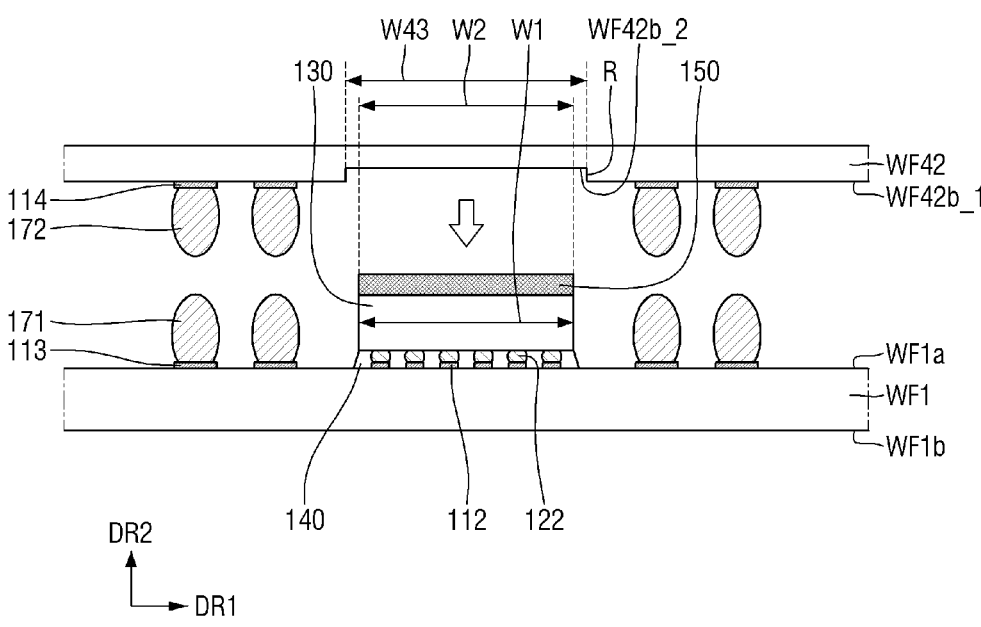
FIGS. 23 through 25 are cross-sectional views illustrating a method of fabricating a semiconductor package according to some embodiments.
Figure 24:
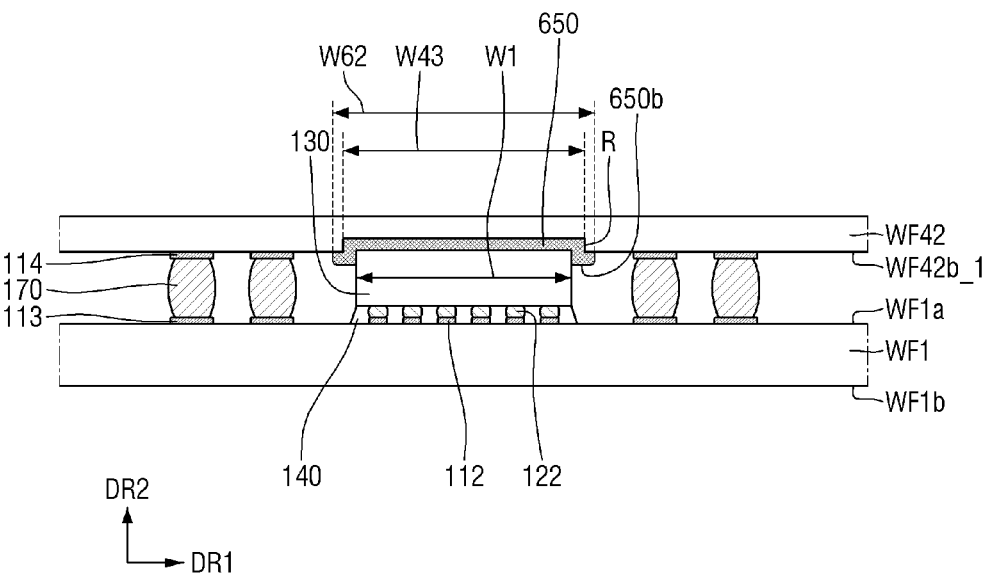

Referring to FIGS. 23 and 24, after the processes illustrated in FIGS. 3 through 5, a second wafer WF42 may be bonded onto a first surface WF1*a* of a first wafer WF1 and a top surface 130*a* of a semiconductor chip 130.

A recess R may be formed in the bottom surface of the second wafer WF42. The recess R may be formed to be recessed from a first bottom surface WF42*b*_1 of the second wafer into the second wafer WF42. Here, the first bottom surface WF42*b*1 of the second wafer WF42 may be defined as a bottom surface of the second wafer WF42 where fourth conductive terminals 114 are formed. A portion of the bottom surface of the second wafer WF42, exposed in the recess R, may be defined as a second bottom surface WF42_*b*2 of the second wafer WF42. That is, the first and second bottom surfaces WF42*b*1 and WF42*b*2 of the second wafer WF42 may have a step difference therebetween. For example, in some embodiments, the first and second bottom surfaces WF42*b*1 and WF42*b*2 of the second wafer WF42 may not be coplanar.

The recess R may overlap with the semiconductor chip 130 in a vertical direction DR2. For example, a width W43, in a horizontal direction DR1, of the recess R may be greater than a width W2, in the horizontal direction DR1, of an adhesive layer 150 of FIG. 23. Also, the width W43, in the horizontal direction DR1, of the recess R may be greater than a width W1, in the horizontal direction DR1, of the semiconductor chip 130. For example, the depth, in the vertical direction DR2, of the recess R may be less than the thickness, in the vertical direction DR2, of the adhesive layer 150, but embodiments are not limited thereto.

For example, an adhesive layer 650 of FIG. 24 may be bonded to the second bottom surface WF42*b*_2 of the second wafer WF42, in the recess R. For example, during the bonding of the second wafer WF2, the adhesive layer 550 may be pressed against the second bottom surface WF42*b*_2 of the second wafer WF42. Thus, in some embodiments, the adhesive layer 650 may be bonded to the first bottom surface WF42*b*_1 of the second wafer WF42, near the recess R. In a state where the first and second bottom surfaces WF42*b*1 and WF42*b*_2 of the second wafer WF42 are bonded to the adhesive layer 650, a width W62, in the horizontal direction DR1, of the adhesive layer 650 may be greater than the width W1, in the horizontal direction DR1, of the semiconductor chip 130. Also, the width W62, in the horizontal direction DR1, of the adhesive layer 650 may be greater than the width W43, in the horizontal direction DR1, of the recess R.

For example, in a state where the second bottom surface WF42*b*_2 of the second wafer WF42 is bonded to the adhesive layer 650, the adhesive layer 650 may be in contact with the sidewalls of the recess R. For example, in a state where the second bottom surface WF42*b*_2 of the second wafer WF42 is bonded to the adhesive layer 650, the adhesive layer 650 may completely fill the recess R, but embodiments are not limited thereto. In some embodiments, at least a portion of the semiconductor chip 130 may be positioned in the recess R.

For example, at least a portion of the adhesive layer 650 may protrude laterally beyond the sidewalls of the semiconductor chip 130. That is, at least a portion of the adhesive layer 650 may not overlap with the semiconductor chip 130 in the vertical direction DR2. For example, at least a portion of the adhesive layer 650 may be formed on the sidewalls of the semiconductor chip 130. For example, at least a portion of the adhesive layer 650 may be in contact with the sidewalls of the semiconductor chip 130.

For example, a lowermost surface 650*b* of the adhesive layer 650 may be formed to be lower than the top surface 130*a* of the semiconductor chip 130. For example, in some embodiments, the lowermost surface 650*b* of the adhesive layer 650 may not be coplanar with the top surface 130*a* of the semiconductor chip 130. That is, the lowermost surface 650*b* of the adhesive layer 650 may be formed to be closer than the top surface 130*a* of the semiconductor chip 130 to the first surface WF1*a* of the first wafer WF1.

Figure 25:
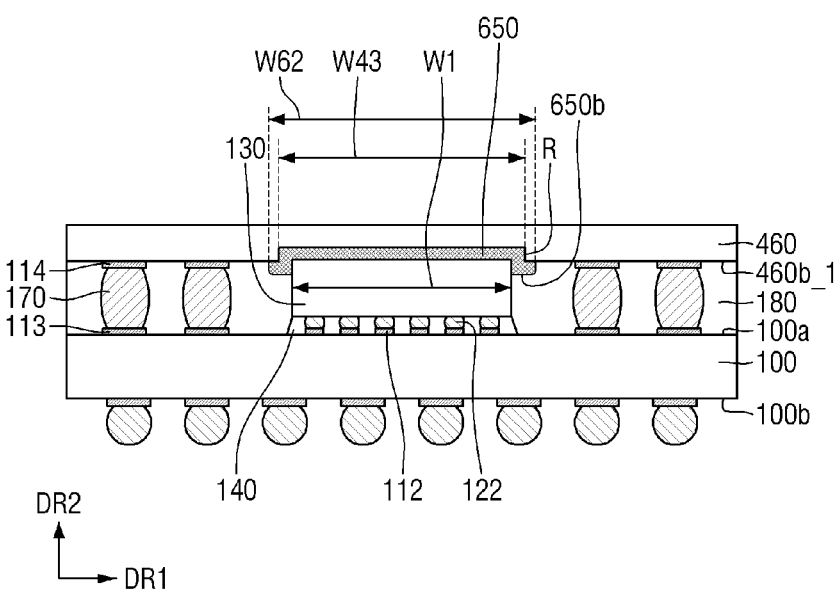

Referring to FIG. 25, a molding layer 180 may be formed between the first surface WF1*a* of the first wafer WF1 and the first bottom surface WF42*b*1 of the second wafer WF42. For example, the lowermost surface 650*b* of the adhesive layer 650 may be in contact with the molding layer 180. For example, the sidewalls of the adhesive layer 650 may be in contact with the molding layer 180, on the first bottom surface WF42*b*_1 of the second wafer WF42.

Thereafter, first conductive terminals 111 and first solder balls 121 may be formed on the second surface WF1*b* of the first wafer WF1. Thereafter, the first wafer WF1, the molding layer 180, and the second wafer WF2 may be cut, thereby obtaining a semiconductor package of FIG. 25.

After the sawing of the first wafer WF1, the molding layer 180, and the second wafer WF42, the first wafer WF1 may be defined as a substrate 100, the second wafer WF42 may be defined as an interposer 460, and the first bottom surface WF42*b*_1 of the second wafer WF42 may be defined as a first bottom surface 460*b*_1 of the interposer 460.

Embodiments of the present disclosure have been described above with reference to the accompanying drawings, but embodiments are not limited thereto and may be implemented in various different forms. It will be understood that the present disclosure can be implemented in other specific forms without changing the technical spirit or scope of the present disclosure. Therefore, it should be understood that the embodiments set forth herein are illustrative in all respects and not limiting.

What is claimed is:

1. A method comprising:
   providing a semiconductor chip having solder balls formed on a bottom surface thereof;
   forming an adhesive layer on a top surface of the semiconductor chip;
   after the adhesive layer is formed, mounting the semiconductor chip on a first wafer using the solder balls;
   bonding a second wafer to the first wafer and to the adhesive layer of the semiconductor chip that is mounted on the first wafer;
   forming a molding layer between the first wafer and the second wafer to surround side walls of the adhesive layer; and cutting the first wafer, the molding layer and the second wafer.

2. The method of claim 1, wherein the adhesive layer is formed on the top surface of the semiconductor chip such that a width of the adhesive layer in a horizontal direction is a same width as a width of the semiconductor chip in the horizontal direction.

3. The method of claim 1, wherein after the cutting each of sidewalls of the cut first wafer, sidewalls of the cut molding layer, and sidewalls of the cut second wafer are aligned in a vertical direction perpendicular to a top surface of the first wafer.

4. The method of claim 1, wherein the bonding comprises connecting a first connector formed on a top surface of the first wafer to a second connector formed on a bottom surface of the second wafer.

5. The method of claim 1, wherein the bonding comprises pressing the adhesive layer such that a width of the adhesive layer in a horizontal direction is greater than a width of the semiconductor chip in the horizontal direction.

6. The method of claim 5, wherein at least a portion of a bottom surface of the adhesive layer is in contact with the molding layer.

7. The method of claim 1, wherein the bonding comprises pressing the adhesive layer such that at least a portion of the adhesive layer extends on sidewalls of the semiconductor chip.

8. The method of claim 1, wherein the bonding comprises forming a recess in the second wafer, the recess being recessed from a bottom surface of the second wafer into the second wafer and a width of the recess in a horizontal direction being greater than a width of the semiconductor chip in the horizontal direction, wherein the adhesive layer is bonded to the second wafer in the recess.

9. The method of claim 8, wherein, after the bonding, a lowermost surface of the adhesive layer is lower than the bottom surface of the second wafer adjacent to the recess.

10. The method of claim 8, wherein, after the bonding, the width of the recess in the horizontal direction is greater than a width of the adhesive layer in the horizontal direction.

11. The method of claim 8, wherein, after the bonding, the adhesive layer completely fills the recess.

12. A method comprising:
providing a semiconductor chip having solder balls formed on a bottom surface thereof;
forming an adhesive layer on a top surface of the semiconductor chip, a width of the adhesive layer in a horizontal direction being a same width as a width of the semiconductor chip in the horizontal direction;
after the adhesive layer is formed, mounting the semiconductor chip on a first wafer using the solder balls;
bonding a second wafer to the first wafer and to the adhesive layer on the semiconductor chip that is mounted on the first wafer; and
forming a molding layer between the first wafer and the second wafer to surround side walls of the adhesive layer.

13. The method of claim 12, further comprising:
after the forming the molding layer, cutting the first wafer, the molding layer and the second wafer,
wherein, after the cutting, each of sidewalls of the first wafer, sidewalls of the molding layer, and sidewalls of the second wafer are aligned with one another in a vertical direction perpendicular to a top surface of the first wafer.

14. The method of claim 12, wherein the bonding comprises pressing the adhesive layer such that, after the bonding, the width of the adhesive layer in the horizontal direction is greater than the width of the semiconductor chip in the horizontal direction.

15. The method of claim 12, wherein the bonding comprises pressing the adhesive layer such that at least a portion of the adhesive layer extends on sidewalls of the semiconductor chip.

16. The method of claim 12, wherein the bonding comprises forming a recess in the second wafer, the recess being recessed from a bottom surface of the second wafer into the second wafer and a width of the recess in the horizontal direction being greater than a width of the semiconductor chip in the horizontal direction,
wherein the adhesive layer is bonded to the second wafer in the recess.

17. A method comprising:
providing a semiconductor chip having solder balls formed on a bottom surface thereof,
forming an adhesive layer on a top surface of the semiconductor chip;
after the adhesive layer is formed, mounting the semiconductor chip on a first wafer using the solder balls;
bonding a second wafer to the first wafer and to the adhesive layer on the semiconductor chip that is mounted on the first wafer; and
forming a molding layer between the first wafer and the second wafer to surround side walls of the adhesive layer,
wherein the bonding comprises pressing the adhesive layer such that, after the bonding, a width of the adhesive layer in a horizontal direction is greater than a width of the semiconductor chip in the horizontal direction.

18. The method of claim 17, wherein at least a portion of a bottom surface of the adhesive layer is in contact with the molding layer.

19. The method of claim 17, wherein at least a portion of the adhesive layer extends on sidewalls of the semiconductor chip.

20. The method of claim 17, wherein the bonding comprises:
forming a recess in the second wafer, the recess being recessed from a bottom surface of the second wafer into the second wafer and a width of the recess in the horizontal direction being greater than the width of the semiconductor chip in the horizontal direction, and
pressing the adhesive layer into the recess in the second wafer such that the adhesive layer completely fills the recess.

* * * * *